United States Patent
Williams

(10) Patent No.: US 7,646,138 B2
(45) Date of Patent: Jan. 12, 2010

(54) DIAMOND ENHANCED THICKNESS SHEAR MODE RESONATOR

(75) Inventor: Oliver Williams, Hasselt (BE)

(73) Assignees: Interuniversitair Microelektronica Centrum (IMEC), Leuven (BE); Universiteit Hasselt, Diepenbeek (BE)

( * ) Notice: Subject to any disclaimer, the term of this patent is extended or adjusted under 35 U.S.C. 154(b) by 0 days.

(21) Appl. No.: 11/944,364

(22) Filed: Nov. 21, 2007

(65) Prior Publication Data

US 2008/0157632 A1 Jul. 3, 2008

Related U.S. Application Data

(60) Provisional application No. 60/866,730, filed on Nov. 21, 2006.

(51) Int. Cl.
*H01L 41/00* (2006.01)

(52) U.S. Cl. .................. 310/333; 347/69; 310/341; 310/364

(58) Field of Classification Search .............. 347/69; 310/313 R, 347
See application file for complete search history.

(56) References Cited

U.S. PATENT DOCUMENTS

| | | | | |
|---|---|---|---|---|
| 5,221,870 A | * | 6/1993 | Nakahata et al. | 310/313 A |
| 5,440,189 A | * | 8/1995 | Nakahata et al. | 310/313 R |
| 5,446,329 A | * | 8/1995 | Nakahata et al. | 310/313 A |
| 5,576,589 A | * | 11/1996 | Dreifus et al. | 310/313 A |
| 5,777,422 A | * | 7/1998 | Kitabayashi et al. | 310/313 A |
| 5,959,389 A | * | 9/1999 | Nakahata et al. | 310/313 A |
| 2004/0083590 A1 | * | 5/2004 | Lee et al. | 29/25.35 |
| 2004/0183397 A1 | * | 9/2004 | Kam et al. | 310/313 R |
| 2005/0088061 A1 | * | 4/2005 | Inoue | 310/363 |

OTHER PUBLICATIONS

Fausett, Bryan, et al., "The Electrochemical Properties of Nanocrystalline Diamond Thin-Films Deposited from C60/Argon and Methane/Nitrogen Gas Mixtures," Electroanalysis 2000, vol. 12, No. 1, at 7-15.

El Hakiki, M., et al., "Diamond Film on Langasite Substrate for Surface Acoustic Wave Devices Operating in High Frequency and High Temperature," Diamond & Related Materials (2006), doi:10.1016/j.diamond.2006.09.002.

Zhang, Y., et al., "Fabrication and Characterization of Diamond Quartz Crystal Microbalance Electrode," Journal of The Electrochemical Society 149 (2002) at H179-H182.

B. Drafts, "Acoustic Wave Technology Sensors," Sensors (Oct. 1, 2000) (available at <http://www.sensorsmag.com/articles/1000/68/main.shtml>).

* cited by examiner

*Primary Examiner*—Walter Benson
*Assistant Examiner*—Bryan P Gordon
(74) *Attorney, Agent, or Firm*—McDonnell Boehnen Hulbert & Berghoff LLP

(57) ABSTRACT

A thickness shear mode (TSM) resonator is described, comprising a diamond layer. The diamond layer is preferably a high quality diamond layer with at least 90% $sp^3$ bonding or diamond bonding. A method for manufacturing such a resonator is also described. The thickness shear mode resonator according to embodiments described herein may advantageously be used in biosensor application and in electrochemistry applications.

24 Claims, 5 Drawing Sheets

DIAMOND ENHANCED THICKNESS SHEAR MODE RESONATOR

The present application claims the priority of Provisional U.S. Patent Application No. 60/866,730, filed Nov. 21, 2006, the disclosure of which is incorporated herein by reference.

This application relates to electronic devices using acoustic waves. More particularly, it relates to thickness shear mode resonators comprising a high quality diamond layer, i.e. a diamond layer with at least 90% $sp^3$ bonding.

BACKGROUND

Quartz crystal microbalance (QCM) oscillators, or more generally, thickness shear mode (TSM) oscillators, have evolved from being used for thickness monitoring in vacuum deposition systems towards their use as electrochemical and biological sensors in liquid and gaseous environments. Because of that, studies of electrical and/or electrochemical properties, surface wettability and stability of biological functionalization of such oscillators have gained importance.

The use of diamond as a surface in such TSM or QCM oscillators for many biological and electrochemical applications would be interesting because diamond has a wide electrochemical window, tuneable wettability by simple stable surface terminations, low friction, extreme chemical stability and bio-inertness. The surface of diamond has been shown to be particularly stable when functionalized with bio-molecules.

In the Journal of the Electrochemical Society 149 (11), H179-H182 (2002), Zhang et al. describe the fabrication of a diamond-coated microbalance electrode by growing a freestanding diamond film and subsequently binding it to a QCM element.

In Diamond & Related Materials (2206), Volume 16, Issues 4-7, April-July 2007, Pages 966-969, Hakiki et al. describe the growth of diamond on langasite for surface acoustic wave (SAW) applications. As the adhesion of diamond on langasite is poor, the stress of the diamond layer should be low. This can be achieved by using a hydrogen-poor plasma during diamond growth, resulting in a diamond layer having a high $sp^2$ bonding, i.e. graphite bonding. $sp^2$ bonding is known to reduce the electrochemical window of diamond (Fausett et al, in Electroanalysis 12 (2000) 7. When applying voltages to electrodes in solution, $sp^2$ or graphite bonding results in redox deterioration of the diamond layer and thus of the electrodes already at relatively low voltages, for example at 0.5V, 1V or higher. Direct growth of diamond on langasite, i.e. growth of diamond on langasite without interlayer, thus results in low quality diamond (i.e. high $sp^2$ content or graphite bonding) with reduced stress to avoid delamination from the langasite. This low stress is achieved by using hydrogen poor (argon/methane) plasma to grow the diamond, which is known to produce material with more than 5% $sp^2$ bonding. (See D. M. Gruen, in Annual Reviews of Materials Science, 29 (1999) 211.)

SUMMARY

Growing diamond on QCM crystals is difficult due to the high temperature range of between 400° C. and 800° C. which is used during the deposition process of diamond. Although the phase transition or Curie temperature of quartz is 570° C., in practice it cannot be used at temperatures higher than 300° C. Consequently the quartz crystal becomes non-piezoelectric after coating with diamond, as the piezoelectric properties of quartz deteriorate far below the actual phase transition temperature.

In the fabrication of a diamond-coated microbalance described by Zhang et al., a relatively thick diamond substrate is used, with a thickness in the order of 20 μm, resulting in an increased cost, high crystal loading and low Q factor. In addition to the shortcomings described above, the SAW devices described by Hakiki et al., by growing diamonds in hydrogen-poor plasmas, produce a grain size of about 5 nm, meaning that there is a larger grain boundary volume fraction. This is bad for electrochemistry and stability as grain boundary carbon can be etched. Furthermore, SAW devices as described by Hakiki et al. do not efficiently operate in liquids. Also, the electrodes cannot be simultaneously used for actuating and electrochemistry applications because the electrodes are outside the area where the wave propagates so they will have no electrochemical effect in that area.

The thickness shear mode resonators described herein may, in preferred embodiments, be used in liquids and gases without the diamond layer being affected or damaged by the liquids or gases used. For example, a thickness shear mode resonator according to embodiments described herein may be used as a sensor, e.g. biosensor, to, for example, measure target molecules in a liquid or a gas.

In a first aspect, a thickness shear mode resonator is provided comprising the following. On a high temperature piezoelectric crystal (1), there is at least one interlayer (3, 4) on a first major surface of this high temperature piezoelectric crystal. At least part of an interlayer (3, 4) is adapted for functioning as a first electrode (3) and at least part of an interlayer (3, 4), i.e. the part on which a diamond layer (5) is be provided, is adapted for allowing growth of a high quality diamond layer (5), this high quality diamond comprising at least 90% $sp^3$ bonding or diamond bonding. On at least part of the at least one interlayer (3, 4) there is a high quality diamond layer (5) comprising at least 90% $sp^3$ bonding or diamond bonding. Because of this high quality diamond layer, i.e. a diamond layer with at least 90% $sp^3$ bonding or diamond bonding, the thickness shear mode resonator according to certain embodiments can be used in liquids and gasses without being damaged or without the diamond layer being released from the device. The device can therefore advantageously be used as a biosensor for detecting biomolecules in a liquid or a gas.

In one embodiment, a thickness shear mode resonator is provided comprising only one interlayer (3) which is adapted both for functioning as a first electrode (3) and for allowing growth of a high quality diamond layer (5) comprising at least 90% $sp^3$ bonding or diamond bonding.

The interlayer (3) of the thickness shear mode resonator may comprise Tungsten, Titanium, Platinum, Nickel, Aluminum, Molybdenum, Niobium, Tantalum, conductive Diamond-like Carbon, or conductive carbon, or a combination thereof. By using a material which facilitates growth of high quality diamond, i.e. diamond with at least 90% $sp^3$ bonding, for forming the electrode, no additional intermediate layer is required for forming high quality diamond.

In another embodiment, the thickness shear mode resonator comprises a plurality of interlayers (3, 4), wherein at least part of a first interlayer is adapted for functioning as a first electrode (3) and wherein at least part of at least one further interlayer (4), on which a diamond layer (5) is to be provided, is adapted for allowing growth of a high quality diamond layer (5) comprising at least 90% $sp^3$ bonding or diamond bonding.

In another embodiment a thickness shear mode resonator is provided, wherein the at least one further interlayer (4) comprises silicon oxide, tungsten, titanium, platinum, Molybdenum, Niobium, Tantalum, Silicon, Silicon Carbide, Diamond-like Carbon, Amorphous carbon, Graphite, Nickel, Aluminium.

In another embodiment, the first electrode (3) is in direct contact with the high temperature piezoelectric crystal (1). With 'in direct contact' is meant that no intermediate layer is provided in between the first electrode and the high temperature piezoelectric crystal.

In another embodiment the first electrode (3) is in indirect contact with the high temperature piezoelectric crystal (1). With 'in indirect contact' is meant that there is at least one intermediate layer present in between the first electrode and the high temperature piezoelectric crystal.

In another embodiment the high temperature piezoelectric crystal (1) is a material with a phase transition temperature or Curie point of higher than 800° C. or higher than 1000° C.

In another embodiment the high temperature piezoelectric crystal (1) comprises one of $La_3Ga_5SiO_{14}$, $La_3Ga_{5.5}Ta_{0.5}O_{14}$, $GaPO_4$, $Li_2B_4O_7$, AlN, GaN, $Al_{1-x}Ga_xN$ with $0 \leq x \leq 1$, $AlPO_4$, $Bi_4Ti_3O_{12}$, $Bi_3TiNbOg$, $Sr_2Nb_2O_7$, $Ca_2Ga_2Ge_4SiO_{14}$, or any other material having a same crystalline structure as $Ca_2Ga_2Ge_4SiO_{14}$.

In another embodiment the thickness shear mode resonator further comprises a second electrode (2) provided on a second major surface of the high temperature piezoelectric crystal (1), the second major surface being at a substantially opposite side of the thickness shear mode resonator than the first major surface.

In another embodiment the second electrode (4) is in direct contact with the high temperature piezoelectric crystal (1). With 'in direct contact' is meant that no intermediate layer is provided in between the second electrode and the high temperature piezoelectric crystal.

In another embodiment the second electrode (2) is in indirect contact with the high temperature piezoelectric crystal (1). With 'in indirect contact' is meant that there is at least one intermediate layer present in between the second electrode and the high temperature piezoelectric crystal.

In another embodiment the high quality diamond layer (5) has a thickness between 20 nm and 2000 nm.

In another embodiment the thickness of the first electrode (3) is between 5 nm and 500 nm.

In another embodiment the high quality diamond layer (5) comprises at least 99% $sp^3$ bonding.

The thickness shear mode resonator of some embodiments can be used for biosensing applications.

In other embodiments, the thickness shear mode resonator is used for electrochemistry applications e.g. monitoring electrodeposition experiments or cyclic voltammetry experiments.

In another aspect of the present disclosure, methods for manufacturing a thickness shear mode resonator are presented. A high temperature piezoelectric crystal is provided on which at least one interlayer (3, 4) is provided on a first major surface of the high temperature piezoelectric crystal. At least part of an interlayer (3, 4) is adapted for functioning as a first electrode (3) and at least part of an interlayer (3, 4), on which a diamond layer (5) is to be provided, is adapted for allowing growth of a high quality diamond layer (5) comprising at least 90% $sp^3$ bonding or diamond bonding. On at least part of the upper interlayer (3, 4) a high quality diamond layer (5), comprising at least 90% $sp^3$ bonding or diamond bonding is provided.

In another embodiment one interlayer (3) is provided which is adapted both for functioning as a first electrode (3) and for allowing growth of a high quality diamond layer (5) comprising at least 90% $sp^3$ bonding or diamond bonding.

In another embodiment, a plurality of interlayers (3, 4) is provided wherein at least part of a first interlayer is adapted for functioning as a first electrode (3) and at least part of at least one further interlayer (4), on which a diamond layer (5) is to be provided, is adapted for allowing growth of a high quality diamond layer (5) comprising at least 90% $sp^3$ bonding or diamond bonding.

In another embodiment, providing a high quality diamond layer (5) is performed by means of hydrogen rich plasma e.g. hydrogen/methane plasma.

In another embodiment the method further comprises pretreating a surface of the at least one interlayer (3, 4) before providing the high quality diamond layer (5).

In another embodiment the method further comprises providing a second electrode (2) at a second major surface of the high temperature piezoelectric crystal (1), the second major surface being at a substantially opposite side of the thickness shear mode resonator from the first major surface.

In another embodiment of the method, the high quality diamond layer (5) comprises at least 99% $sp^3$ bonding.

In another aspect the thickness shear mode resonator is manufactured by a method as described above.

Particular and preferred aspects of the invention can be found in the independent and dependent claims. Features from the dependent claims may be combined with features of the independent claims and with features of other dependent claims.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Several embodiments are described below in conjunction with the appended drawing figures, wherein like reference numerals refer to like elements in the various figures.

DETAILED DESCRIPTION

Figure 1A:
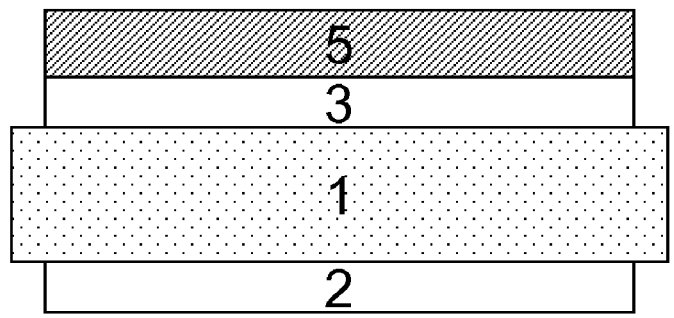
FIGS. 1(a) to 1(f) schematically illustrate different configurations for a thickness shear mode resonator.

The present invention will be described with reference to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Furthermore, the terms first, second and the like in the description and in the claims are used for distinguishing between similar elements and not necessarily for describing a sequential or chronological order. The terms are interchangeable under appropriate circumstances and the embodiments of the invention can operate in other sequences than described or illustrated herein.

Moreover, the terms underneath and the like in the description and in the claims are used for descriptive purposes and not necessarily for describing relative positions. The terms so used are interchangeable under appropriate circumstances and that the embodiments of the invention described herein can operate in other orientations than described or illustrated herein.

The term "comprising", used in the claims, should not be interpreted as being restricted to the means listed thereafter; it does not exclude other elements or steps. It should be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practised without these specific details. In other instances, well-known methods, structures and techniques have not been shown in detail in order not to obscure an understanding of this description.

The invention will now be described with reference to a detailed description of several embodiments. It is clear that other embodiments of the invention can be configured according to the knowledge of persons skilled in the art without departing from the true spirit or technical teaching of the invention, the invention being limited only by the terms of the appended claims.

As already mentioned above, the use of diamond in quartz crystal microbalance (QCM) may be interesting for many biological and electrochemical applications due to its wide electrochemical window, tuneable wettability by simple stable surface terminations, low friction, extreme chemical stability and bio-inertness. Significantly, the surface of diamond has been shown to be particularly stable when functionalized with bio-molecules. This fact makes diamond interesting for biosensing applications by using QCM where the detection of mass loading effects could be adversely effected by bio-molecules becoming spontaneously un-tethered from the sensor surface.

To bypass the restrictions in terms of temperature of the quartz phase transition as mentioned above, the quartz crystal can be replaced with a high temperature stable piezoelectric. A high temperature piezoelectric crystal is a crystal with a high phase transition temperature or high Curie point, in this context a temperature higher than the diamond growth temperature, which is typically between 400° C. and 800° C. For example in case of piezoelectric langasite ($La_3Ga_5SiO_{14}$) phase transition only occurs at the melting point which is 1475° C. Furthermore, also gallium phosphate ($GaPO_4$) with a phase transition at 970° C. and langatate ($La_3Ga_{5.5}Ta_{0.5}O_{14}$) in which phase transition only occurs at its melting point which is 1450° C. may be used as replacement materials for quartz in QCM. In these cases instead of quartz crystal microbalance, the corresponding device can be called by its more generic name: thickness shear mode (TSM) resonator or TSM oscillator. It should be noted that wherever in the description and in the claims the terms TSM resonator and TSM oscillator are used, a same device is meant.

Langasite, $GaPO_4$, langatate and most other high temperature stable piezoelectric materials are fragile at a thicknesses required for MHz operation (~200-300 μm). Therefore, the stress created by layers of material provided on top of these high temperature piezoelectric materials needs to be limited. This can be achieved by reducing the stress of the layers on top of the high temperature piezoelectric materials or by reducing the thickness of these layers. Thinner piezoelectric materials also allow using a higher frequency, thereby increasing the sensitivity. The growth of thin diamond layer on top of the above-mentioned high temperature piezoelectric materials, however, is not straightforward.

The present disclosure provides a thickness shear mode resonator and a method for manufacturing such a thickness shear mode resonator. The thickness shear mode resonator comprises:

a high temperature piezoelectric crystal having a first major surface, at least one interlayer on the first major surface of the high temperature piezoelectric crystal of which at least part of an interlayer, e.g. a first one of the at least one interlayer, is adapted for functioning as a first electrode, and of which at least part of an interlayer, e.g. an upper interlayer on which a diamond layer is to be provided, is adapted for allowing growth of a high quality diamond layer comprising at least 90% $sp^3$ bonding or diamond bonding thereon, and a high quality diamond layer on at least part of the upper interlayer, the diamond layer comprising at least 90% $sp^3$ bonding or diamond bonding.

A higher the percentage of $sp^3$ bonding results in a higher electrochemical window (resistance against electrochemical attack). Depending on the chemistry and voltages, the percentage of $sp^3$ bonding should be higher than 90%, even better higher than 95%, even better higher than 98%, even better higher than 99%, even better higher than 99.5%, or even better higher than 99.8%.

The upper interlayer on which a diamond layer is deposited can be adapted for allowing the growth of high quality diamond. On some layers it is possible to grow high quality diamond. This means that the layer will facilitate high quality diamond growth.

Furthermore the upper interlayer must withstand the high temperatures during diamond growth (400° C.-700° C.). This especially may be a problem for metals. So the layer may not evaporate at these high temperatures, may not change to a structure that does not allow high quality diamond growth.

Furthermore, the adhesion of diamond on the interlayer needs to be good, meaning that the high quality diamond may not peel off from the interlayer. High quality diamond, having a high percentage of $sp^3$ bonding, has a higher stress when compared to low quality diamond, having a lower percentage of $sp^3$ bonding. So there is a higher risk that high quality diamond may peel-off when compared to low quality diamond. Diamond adhesion can be improved by using appropriate interlayer(s).

A thickness shear mode resonator according to embodiments described herein may be fabricated at high temperatures (e.g., at temperatures above 700° C.-1000° C.) and can be operated at room temperature. Furthermore, such a thickness shear mode resonator can be used in a liquid or a gas without the diamond layer being affected or damaged by the liquid or gas used. For example, the thickness shear mode resonator may be used as a sensor, e.g. biosensor, for, for example, detecting target molecules in a liquid or a gas.

A method for manufacturing a thickness shear mode resonator comprises:
providing a high temperature piezoelectric crystal having a first major surface,
providing at least one interlayer on the first major surface of the high temperature piezoelectric crystal of which at least part of an interlayer is adapted for functioning as a first electrode, and of which at least part of an interlayer on which a diamond layer is to be provided is adapted for allowing the growth of a high quality diamond layer comprising at least 90%, $sp^3$ bonding or diamond bonding on, and providing a high quality diamond layer on at least part of an interlayer, the diamond layer comprising at least 90% $sp^3$ bonding or diamond bonding.

A higher the percentage of $sp^3$ bonding will result in a higher electrochemical window (resistance against electrochemical attack). The percentage of $sp^3$ bonding can be higher than 90%, even better higher than 95%, even better higher than 98%, even better higher than 99%, even better higher than 99.5%, or even better higher than 99.8%.

With the methods described herein, a thickness shear mode resonator comprising a thin diamond layer of between 20 nm and 2000 nm of high quality with reduced stress may be obtained when compared to other shear mode resonators using thick diamond layers, a thinner diamond layer having less stress than a thicker layer.

Hereinafter, the thickness shear mode resonator according to embodiments of the invention will be described by means of some examples and figures. It should be understood that these examples and figures are not intended to limit the invention in any way but are only for the purpose of explanation.

In FIGS. 1(a) to 1(f) different configurations for a thickness shear mode resonator are illustrated. In all configurations, a high temperature piezoelectric crystal 1 is selected as a substrate. The high temperature piezoelectric crystal 1 may comprise langasite ($La_3Ga_5SiO_{14}$), langatate ($La_3Ga_{5.5}Ta_{0.5}O_{14}$), Gallium Phosphate ($GaPO_4$), Lithium tetraborate ($Li_2B_4O_7$), Aluminum Nitride (AlN), Gallium Nitride (GaN), Aluminium Gallium Nitride ($Al_{1-x}Ga_xN$, $0 \leq x \leq 1$), Aluminum Phosphate ($AlPO_4$), Bismuth Titanate ($Bi_4Ti_3O_{12}$), $Bi_3TiNbO_g$, $Sr_2Nb_2O_7$, $Ca_2Ga_2Ge_4SiO_{14}$, or any other material having a same or similar crystalline structure as $Ca_2Ga_2Ge_4SiO_{14}$, such as, for example, $La_3Ga_{5.5}Nb_{0.5}O_{14}$ and the like. In fact any high temperature piezoelectric crystal, more specifically any piezoelectric crystal with a phase transition temperature or Curie point higher than 800° C. can be used for forming a thickness shear mode as described herein.

The resonance frequency of the thickness shear mode resonators described herein will depend on the thickness and the material of the high temperature piezoelectric crystal 1 used to form the thickness shear mode resonator. The thickness of the high temperature piezoelectric crystal 1 may, for example, be between 50 μm and 2000 μm, between 100 μm and 1500 μm, between 200 μm and 1000 μm, between 300 μm and 700 μm, between 100 μm and 500 μm, between 300 μm and 500 μm. The resonant frequency of the thickness shear mode resonator may, for example, vary between 2.4 MHz and 10 MHz.

On a first major surface, also referred to as first side, of the high temperature piezoelectric crystal 1, at least one layer of material is provided. At least part of a first layer of the at least one layer of material is adapted for functioning as a first electrode 3. Onto the at least one layer, the thickness shear mode resonator comprises a high quality diamond layer 5 comprising at least 90%, even better at least 95%, even better at least 99% $sp^3$ bonding or diamond bonding.

At least part of the material of this first layer 3 may furthermore at least partly be adapted for allowing growth of a high quality diamond layer comprising at least 90%, even better at least 95%, even better at least 99% $sp^3$ bonding or diamond bonding. The part of the first layer adapted for functioning as a first electrode 3 and the part adapted for allowing growth of a high quality diamond layer 5 may be the same. For example, in FIG. 1(a), a first layer is completely adapted for both functioning as a first electrode 3 and for allowing growth of a layer 5 of high quality diamond. However, the part of the first layer adapted for functioning as a first electrode 3 and the part adapted for allowing growth of a high quality diamond layer may also be different. In that case, the first layer may comprise two different materials (see for example FIG. 1(f)). In FIG. 1(f) a first part of the first layer is adapted for functioning as a first electrode 3 and a second part 4 may be adapted for allowing growth of a high quality diamond layer 5. According to still further embodiments, the first part of the first layer may be adapted for functioning as a first electrode 3 and both the first and second part of the first layer may be adapted for allowing growth of a high quality diamond layer 5 (see for example FIG. 1(d)).

According to other embodiments, the thickness shear mode resonator may comprise at least two layers in between the high temperature piezoelectric crystal 1 and the high quality diamond layer 5. In that case, a first layer, which is in direct contact with the high temperature piezoelectric crystal 1 or with an intermediate layer present on the high temperature piezoelectric crystal 1 (see below) may at least partly be adapted for functioning as a first electrode 3, and a second layer 4 (also referred to as interlayer 4) may be adapted for allowing growth of a high quality diamond layer 5 (see for example FIG. 1(*b*)). According to these embodiments, the extra interlayer on top of the first electrode 3 may improve adhesion of high quality diamond layer 5 to the high temperature piezoelectric crystal 1.

At a second major surface, also referred to as second side, of the high temperature piezoelectric crystal 1, the thickness shear mode resonator may comprise a second electrode 2. The second major surface may be at substantially an opposite side of the thickness shear mode resonator as the first major surface.

These first and second electrodes 3, 2 may be used to apply voltages to the high temperature piezoelectric crystal 1 to induce a resonance frequency. If desired, extra electrodes can be added for other purposes. These electrodes can be used for voltametry, to apply a DC or low frequency AC signals (apart from the high frequency signal used for crystal oscillation). They can be used for electrochemistry, to stimulate chemical and/or biological reactions, to induce or improve bonding of biological molecules on the diamond surface, to measure adsorbed mass, and any other application known in the field.

The first and second electrodes 3, 2 may comprise any suitable conducting material known by a person skilled in the art. For example, the electrodes 2, 3 may comprise metal, for example Gold (Au), Silver (Ag), Aluminum (Al), Tungsten (W), Chromium (Cr), Titanium (Ti), Molybdenum (Mo), Nickel (Ni), Platinum (Pt), Niobium (Nb), Tantalum (Ta) or conductive Diamond-like Carbon (DCL). The electrodes 2, 3 may, according to other embodiments, comprise non-metal materials such as conductive carbon or indium tin oxide (ITO). The electrodes 2, 3 may also comprise different conducting materials, alloys, different layers or a stack of conducting materials. The first and second electrodes 3, 2 may comprise a same material. Alternatively, the material of the first electrode 3 and the material of the second electrode 2 may differ from each other.

The electrodes 2, 3 can be provided in direct contact with the high temperature piezoelectric crystal 1. "In direct contact" means that no intermediate layers are present in between the high temperature piezoelectric crystal 1 and the electrodes 2, 3. According to other embodiments, at least one intermediate layer (not illustrated) may be present between the electrodes 2, 3 and the high temperature piezoelectric crystal 1. This at least one intermediate layer may comprise one or more sub-layers. The one or more sub-layers of the at least one intermediate layer can have similar or different functions, such as, for example, improving the adhesion of the electrodes on the crystal, acting as a barrier layer to avoid or limit diffusion of the electrode material(s) into the crystal, or any other function known to a person skilled in the art. The at least one intermediate layer can be a barrier layer or can comprise one or more barrier layers.

Care should be taken that the material of the electrodes 2, 3 does not diffuse into the high temperature piezoelectric crystal 1. If it does, the resonance frequency may change, especially when the diffusion region becomes metallically conductive. There may also be a reduction of the Q factor (quality-factor), especially when the electrode/diamond interface becomes broader, resulting in a broader resonance frequency range (peak).

Diffusion of electrode material into the high temperature piezoelectric crystal 1 at high temperatures can be reduced by an appropriate choice of electrode material, i.e. by choosing a material for forming the electrodes 2, 3 that does not tend to diffuse into the material of the high temperature piezoelectric crystal 1. Also, barrier materials, such as additional intermediate layers between the high temperature piezoelectric crystal 1 and the electrodes 2, 3 can reduce the diffusion of electrode material into the material of the high temperature piezoelectric crystal 1.

If desired, at least one of the electrodes 2, 3 may be patterned. This may be done by using methods known in the art, such as, for example, lithography in combination with dry and/or wet etching or lift-off techniques.

The electrodes 2, 3 may both substantially fully cover the first and second main surface of the high temperature piezoelectric crystal 1 (as illustrated in FIGS. 1(*a*) and 1(*b*)). In that case, a full first layer of material is adapted for functioning as the first electrode 3. According to other embodiments, the first electrode 3 may be patterned to only partly cover the first main surface of the high temperature piezoelectric crystal 1 while the second electrode 2 may substantially fully cover the second main surface of the high temperature piezoelectric crystal 1 (see FIGS. 1 (*c*) to 1(*f*)). According to these embodiments, only part of a first layer may be adapted for functioning as the first electrode 3. According to still further embodiments (not illustrated), the second electrode 2 may also be patterned to only partly cover the second main surface of the high temperature piezoelectric crystal 1.

The electrodes 2, 3 may have any suitable shape known by a person skilled in the art such as for example a narrow line, a square connected to a line, a circle connected to a line. The overlapping parts of electrodes 2 and 3 (the parts of the electrodes that overlap at opposite sides, often geometrical structures such as circles, squares, etc.) of the piezoelectric crystal realise the oscillation of the piezoelectric crystal. Often conducting lines or connections of other shapes (preferably not overlapping at opposite sides of the crystal) are connected to these overlapping parts to realise electrical connections to electrodes. When these connections are not overlapping at opposite sides they do not take part in generating the oscillation. That way good control of the oscillation can be realised.

The thickness of the electrodes 2, 3 may be between 5 nm and 500 nm, between 20 nm and 400 nm, between 30 nm and 300 nm, between 30 nm and 200 nm, between 30 nm and 150 nm, between 50 nm and 300 nm, between 50 nm and 200 nm, between 50 nm and 150 nm, or between 50 nm and 100 nm. A thin electrode layer can be used, provided that the layer conducts current and voltages can be applied to the crystal 1. The thickness of the electrodes 2, 3 may be chosen such that a continuous conducting layer is formed, in the best case a layer without or substantially without holes or defects.

As already mentioned above, onto the at least one layer of material a high quality diamond layer 5 is provided. For example, a high quality diamond layer 5 may be provided on the at least one layer of material by means of a hydrogen rich plasma, e.g. a hydrogen/methane plasma.

The deposition of diamond may, for example, be performed as follows. Diamond growth seeds from a colloidal dispersion of monodisperse nanodiamond particles in water or ethanol. Before deposition of diamond different surface treatments may be performed. The structure on which diamond is to be provided can be immersed in a solution, for example a solution of detonation nano-diamond powder and ethanol, and then can be bath ultrasonicated. Subsequently, the structure may be rinsed, for example in pure ethanol, followed by nitrogen blow drying. The deposition of diamond can be carried out by a chemical vapour deposition process such as Microwave Plasma Enhanced or Hot Filament assisted Chemical Vapour Deposition (MWPECVD or HFCVD respectively). Diamond growth can be performed with a low concentration of methane (0.1-5%) diluted in either hydrogen or Argon. Growth temperatures and pressures may respectively be between 400° C. and 1000° C. and between 10 Torr and 100 Torr.

The thickness of the diamond layer 5 may range between 20 nm and 2000 nm, between 30 nm and 1500 nm, between 50 nm and 1000 nm, between 50 nm and 300 nm, between 50 nm and 200 nm, between 50 nm and 250 nm, between 50 nm and 100 nm, or between 100 nm and 200 nm. The thickness can be chosen such that the film will be completely coalesced. Films below a certain thickness (thickness depending on the nucleation density) that are not completely coalesced may have pin holes in between the grains that will ruin the electrochemical performance.

The diamond can be doped with dopant elements such as boron or nitrogen to provide conductivity, such that the thickness shear stress resonator is suitable to be used for, for example, electrochemical applications.

The structure of the diamond can be polycrystalline, with nano-sized crystals, also referred to as nanocrystalline diamond.

The provision of the diamond layer results in a thickness shear mode resonator comprising a diamond layer 5 of high quality, i.e. comprising a high amount of at least 90%, $sp^3$ bonding or diamond bonding. Preferably, the level of $sp^3$ bonding is at least 95%, or even better at least 99%. There is a correspondingly low amount of $sp^2$ bonding, and a reduced number of defects, e.g. pinhole defects or voids, with respect to prior art resonators comprising diamond layers. This may be advantageous for applications such as electrochemistry applications, e.g. monitoring electrodeposition of materials or cyclic voltammetry experiments, and biosensing applications.

Furthermore, the grain size of the diamond in the high quality diamond layer 5 may be higher than 30 nm and may, for example, vary between 30 nm and 500 nm, between 40 nm and 300 nm, between 50 nm and 200 nm, between 30 nm and 100 nm, or between 50 nm and 100 nm which is larger than grain size (about 5 nm) for diamond grown from hydrogen poor plasmas as is the case in methods according to the prior art. Higher grain sizes result in a smaller grain boundary volume fraction, which may be advantageous for electrochemistry applications and stability of the resonator as less grain boundary carbon of the diamond can be etched.

A diamond layer of high quality allows for the thickness shear mode resonator to comprise a thin diamond layer of, for example of between 50 nm and 250 nm or between 5 nm and 300 nm, grown with good adhesion to the underlying layer. Good adhesion refers to the lack of delamination during operation, for example during immersion in a liquid or gas.

Growth of high quality diamond could be performed on materials such as, for example silicon oxide ($SiO_2$), tungsten (W), titanium (Ti), platinum (Pt), Molybdenum (Mo), Niobium (Nb), Tantalum (Ta), Silicon (Si), Silicon Carbide (SiC), Diamond-like Carbon (DLC), Amorphous carbon (C), Graphite (C) Nickel (Ni), Aluminum (Al). In these cases, when these materials are used for forming the first electrode 3, no interlayer 4 may be required for obtaining a high quality diamond layer 5 with good adhesion.

However, high quality diamond cannot be grown directly on high temperature piezoelectric crystals and cannot be grown on certain electrode materials, such as for example Au and Ag. In these cases, provision of at least one interlayer 4 which allows growth of a high quality diamond layer 5 may be required before depositing the diamond layer 5. Suitable materials to be used for providing the at least one interlayer 4 may be silicon oxide ($SiO_2$), tungsten (W), titanium (Ti), platinum (Pt), Molybdenum (Mo), Niobium (Nb), Tantalum (Ta), Silicon (Si), Silicon Carbide (SiC), Diamond-like Carbon (DLC), Amorphous carbon (C), Graphite (C) Nickel (Ni), Aluminum (Al).

The at least one interlayer 4 may comprise one uniform material or alloy. The at least one interlayer 4 may also comprise different materials or alloys. The at least one interlayer 4 may also comprise different materials or alloys on different locations, for example islands of different materials. In case a plurality of interlayers 4 is provided, only the top layer or the layer on which the high quality diamond layer 5 is to be provided need be such that it allows growth of a high quality diamond layer 5, whereas interlayers underneath the top layer may have different functionalities, such as for example stress reduction. However, according to other embodiments all interlayers 4 of the plurality of interlayers 4 may comprise a same material.

The thickness of the at least one interlayer 4 may be between 1 nm and 500 nm, between 5 nm and 200 nm, between 5 nm and 100 nm, between 5 nm and 50 nm, between 5 nm and 30 nm, between 30 nm and 200 nm, between 30 nm and 150 nm, between 30 nm and 100 nm, between 30 nm and 50 nm, between 50 nm and 300 nm, between 50 nm and 200 nm, or between 50 nm and 100 nm, or between 50 nm and 100 nm.

Figure 1B:
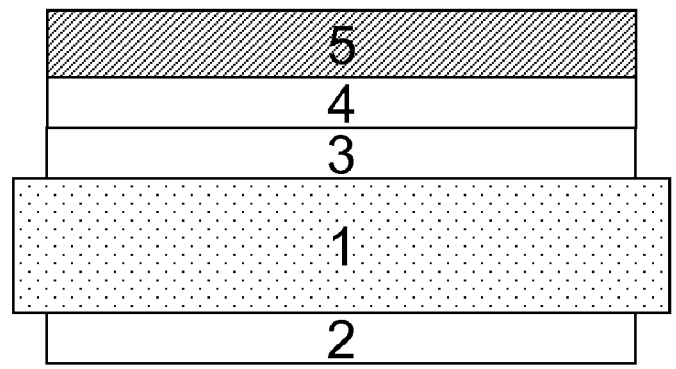

The at least one interlayer 4 may be deposited on the complete first layer which is adapted to function as a first electrode 3, as, for example, can be seen from FIG. 1(b).

In case high quality diamond cannot be grown on the material of the electrode 3, at least one interlayer 4 should be provided thereby at least covering locations where a high quality diamond layer 5 is to be provided.

Figure 1C:
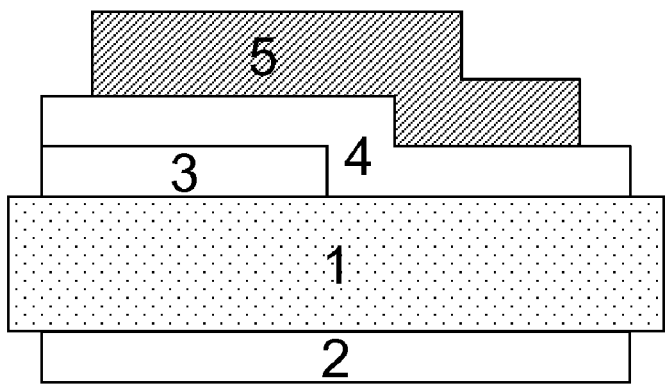
Figure 1D:
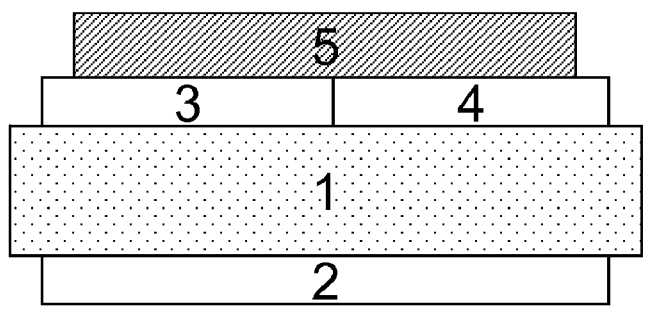
Figure 1E:
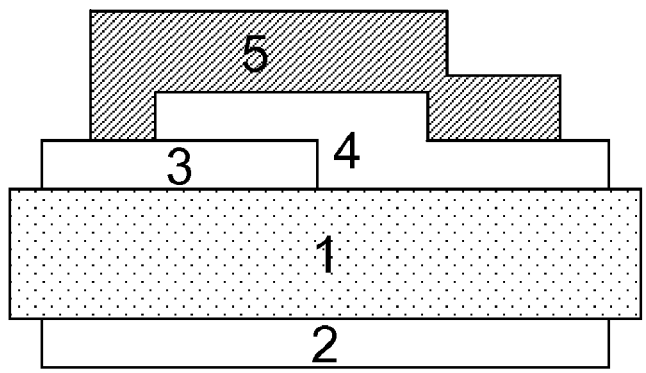
Figure 1F:
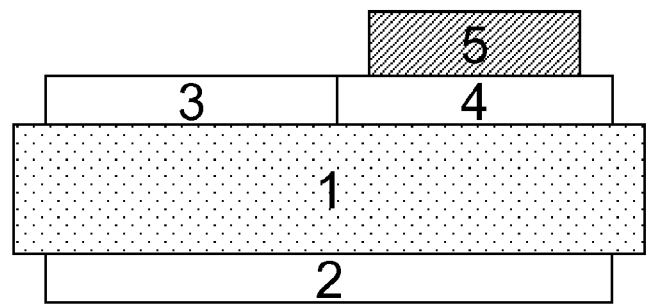

The interlayer 4 may fully cover a major surface of the first electrode 3 (see FIGS. 1(b) and 1(c)) or may partly cover a major surface of the first electrode 3 (see for example FIG. 1(e)).

In case the first electrode 3 only covers part of the high temperature piezoelectric crystal 1 or part of an intermediate layer present on the piezoelectric crystal 1, at least one interlayer 4 may be used at least at locations where diamond is to be provided that are not covered by the electrode material (see FIGS. 1(c), 1(d), 1(e) and 1(f)). In case the electrode material allows growth of a high quality diamond layer 5, the at least one interlayer 4 does not have to, but may, cover the first electrode 3. However, in case the electrode material does not allow growth of a high quality diamond layer 5, the at least one interlayer 4 may also cover the first electrode 3.

It should be noted that the configurations as shown in FIG. 1 are only examples and are not intended to limit the invention in any way.

The frequency response of the thickness shear mode resonator, such as those represented in FIGS. 1(a) to 1(f), may be improved by optimizing the device configuration. For example, decreasing the size of the electrodes 2, 3 may reduce anharmonic resonances.

The Q factor of the thickness shear mode resonator, which is defined by the ratio of the resonance frequency of the resonator and the (full width at half maximum) bandwidth of the resonance, can also be improved, i.e. increased, by forming the first electrode 3 using a refractory metal upon which high quality diamond can be directly grown. This may reduce the overall crystal load. Examples of suitable refractory metals which can be used include tungsten, tantalum, molybdenum and Niobium.

Smoother surfaces on the high temperature piezoelectric material, the electrodes and the diamond layer may also improve the performance of the resonator. The RMS roughness can be below 2 nm. This can be obtained by, for example, improved polishing of the langasite, a thinner diamond layer, or any method known in the art resulting in a reduction of the roughness.

The thickness shear mode resonator may have a number of applications in, for example bio-sensing, such as electrochemical microgravity and visco-elastic monitoring of molecule/diamond surface interactions. In that case an upper surface of the high quality diamond layer 5 may be functionalized. Thickness shear mode resonators as described herein are preferably simple, cheap and robust. In some implementations, they should be capable of detecting changes in mass as low as 0.1 ng/cm$^2$ and of relatively easily detecting most bio-macromolecules. Hence a thickness shear mode resonator as described herein may be a good biosensor for liquid or gas operation, with the added benefit of the wide electrochemical window of diamond.

Figure 2:
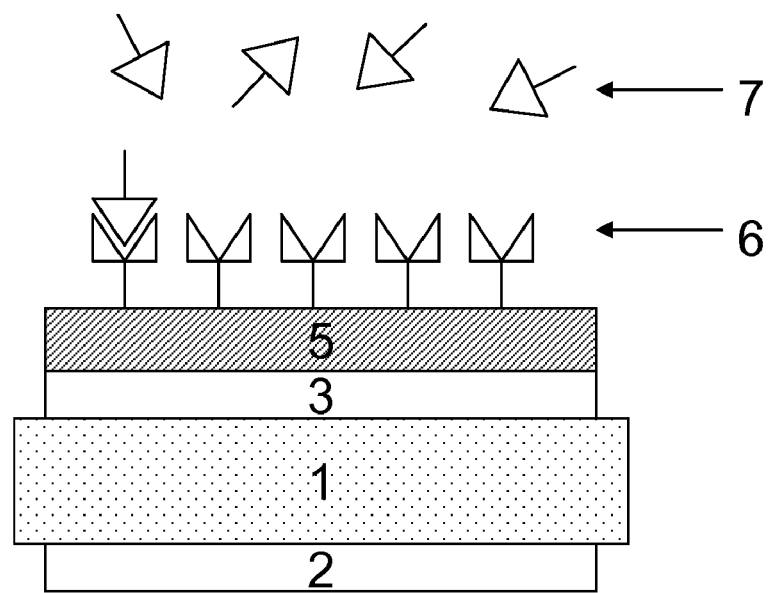
FIG. 2 illustrates the principle of a thickness shear mode resonator used as a biosensor with an antibody attached to the diamond surface.

A thickness shear mode resonator may be used as a biosensor. Therefore, antibodies may be attached to an upper surface of the high quality diamond layer 5. This is illustrated in FIG. 2. By providing a relevant antibody 6, e.g. an antibody specific to an antigen 7 to be detected, to an upper surface of the diamond layer 5, the thickness shear mode resonator can be used to, for example, detect pathogens or other molecules by mass loading. The antibodies 6 will specifically bind to the antigen 7 to be detected. This will result in a significant downward frequency shift in the resonance frequency of the thickness shear mode resonator. The diamond layer 5 provides a very stable surface for antibody attachment. When combining different thickness shear mode resonators, for example in an array, each thickness shear mode resonator coated with a different antibody 6 for specifically binding different antigens 7, the thickness shear mode resonator can be used to detect different antigens 7 at once. Because of the high quality of the diamond layer 5 no deterioration of the diamond layer occurs during use of the thickness shear mode resonator in liquids or gasses in which the antigens to be detected are present.

Another application for which a thickness shear mode resonator may be used is in electrochemical microgravity. For this application the thickness shear mode resonator can be configured as, for example, represented in FIG. 1(*a*) or 1(*b*). A high temperature piezoelectric crystal 1 may be used, with the second electrode 2 being a metal electrode. At the other side of the thickness shear mode resonator, a boron or nitrogen doped diamond layer 5 is provided onto the first electrode 3 which may also be a metal electrode (see FIG. 1(*a*)). If required and depending on the metal used for the first electrode 3, an interlayer 4 may be provided in between the first electrode 3 and the diamond layer 5 (see FIG. 1(*b*)). If an interlayer 4 is provided, this interlayer 4 is conductive for providing electrical access to the diamond layer 5. In this way the thickness shear mode resonator can monitor a shift in resonance frequency due to mass loading by electrodeposition. The thickness shear mode resonator comprising a diamond layer 5 can also be used in cyclic voltammetry experiments, with the benefit of monitoring any change in the mass at the surface of the diamond layer 5.

Hereinafter, the method and thickness shear mode resonator will be further illustrated by means of some examples. These examples are only for the purpose of illustrating and are not intended to limit the invention in any way.

EXAMPLE 1

A prototype thickness shear mode resonator comprising a langasite piezoelectric crystal 1 and a nanocrystalline diamond layer 5 on an SiO$_2$ interlayer 4 was demonstrated (configuration as illustrated in FIG. 1(*b*)). This thickness shear mode resonator resonated at 5 MHz proving that the langasite substrate was capable of withstanding the high temperature CVD diamond deposition process.

Commercially sourced langasite thickness shear mode resonator with silver electrodes 2, 3 with a thickness of ~300 nm and with a resonance frequency around 5 MHz were used. In order to facilitate growth of high quality diamond on the thickness shear mode resonator, a SiO$_2$ interlayer 4 with a thickness of 100 nm was deposited by magnetron sputtering before the diamond layer 5 was provided. After provision of the SiO$_2$ interlayer 4, the structure was immersed in a solution of detonation nano-diamond powder and ethanol, and bath ultrasonicated for 30 minutes. Subsequently, the structure was rinsed in pure ethanol, followed by nitrogen blow drying.

The structure was then placed inside an Astex 6500 Microwave Plasma Enhanced Chemical Vapor Deposition (MW-PECVD) reactor and pumped down to a vacuum better than $1 \times 10^{-3}$ mbar to grow a diamond layer 5 of ~100 nm. Growth parameters were 4% CH$_4$ diluted by H$_2$, 2000 W microwave power, 25 Torr, ~700° C. for 60 minutes. The temperature was monitored in-situ by a Williamson Pro92 dual wavelength pyrometer.

Scanning electron micrograph (SEM) images showed facetted nanocrystalline diamond. The grain size of the diamond film was between 50 nm and 200 nm. The large grain size was due to the rather thick nature of the film (~100 nm) and high CH$_4$ content used during the growth. The morphology of the diamond layer 5 could be optimized considerably by reducing the CH$_4$ content and by decreasing the thickness. An optimized diamond film had the following characteristics: a grain size of between 20 nm and 50 nm and a thickness of <50 nm. The diamond film 5 had clearly coalesced in significantly less time than the growth duration used here (30 minutes), as there were large crystal facets and no visible pin holes over the entire sample surface.

Figure 3:
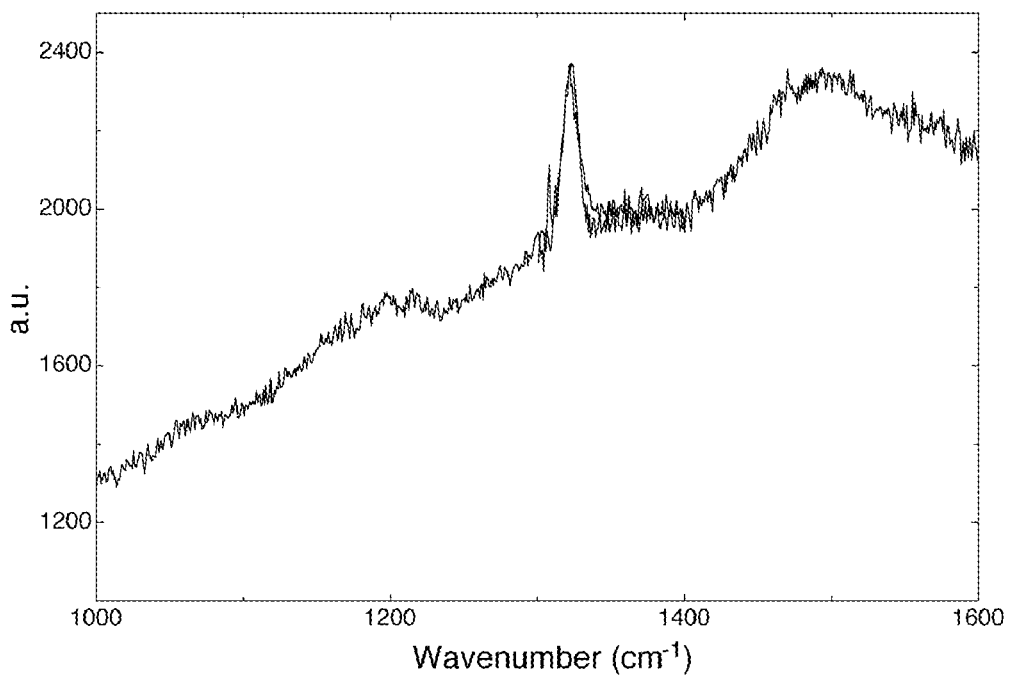
FIG. 3 shows a Raman spectrum for a nanocrystalline diamond coating on a $SiO_2$ interlayer on a langasite shear mode resonator.

The Raman spectrum of the nanocrystalline diamond layer 5 formed in this example is shown in FIG. 3. A pronounced peak around 1332 cm$^{-1}$ is clearly visible, indicative of sp$^3$ bonding. This peak is significantly broadened due to the small crystallite size of the diamond grown in this example. A small shoulder starting around 1100-1200 cm$^{-1}$ and a band at around 1450 cm$^{-1}$ are accompanying this peak. Both of these features are attributable to non-diamond carbon and are usually observed together. The 1150 cm$^{-1}$ and 1450 cm$^{-1}$ peaks in diamond are attributed to small amounts of transpolyacetylene at the grain boundaries of nanocrystalline diamond. In addition features at 1560 cm$^{-1}$ are attributable to disordered carbon presumably also at the grain boundaries. Hence, there is evidence of non-diamond carbon as well as diamond, as is expected for nanocrystalline diamond, due to the high volume fraction of grain boundaries.

A bulk wave oscillation was generated between the two metal electrodes 2, 3 of the thickness shear mode resonator, whereas the SiO$_2$ interlayer 4 and nanocrystalline diamond layer 5 gave rise to a shift of the resonance frequency due to mass loading. The frequency response of the nanocrystalline diamond coated langasite resonator was characterized with a Hewlett Packard HP4194A Impedance/Gain—Phase analyzer, operated in the gain—phase mode. The drive voltage was 0.125V peak to peak.

Figure 4:
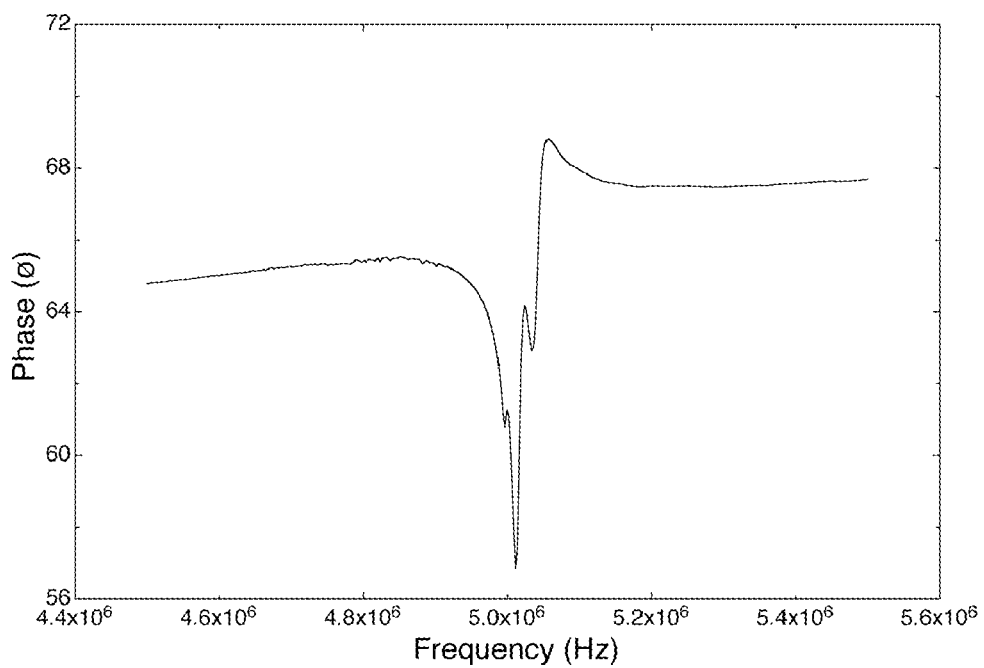
FIG. 4 shows a graph illustrating phase shift in function of frequency for a nanocrystalline diamond-coated langasite thickness shear mode resonator with silver electrodes.

FIG. 4 shows the phase response against frequency for the thickness shear mode resonator formed in this example. Clear resonance behaviour was observed in the phase response as a sharp discontinuity in the phase response at the resonance frequency. However, two spurious anharmonic resonances were observed near the resonant frequency. These may be due to the high piezoelectric coupling coefficient of langasite and are not generally observed on quartz oscillators. These anharmonic resonances do not effect the operation of the resonator with a standard phase lock amplifier, as often commercially used to track the resonance frequency of QCM crystals.

The resonance frequency of the resonator according to this example was found to be around 5.01 MHz, which is very near that of the virgin resonator of 4.95 MHz. Hence the deposition of diamond at high temperature had not destroyed the piezoelectric effect of this material, although it had somewhat damped the oscillation and reduced the Q factor. In fact the resonance frequency had increased very slightly compared to the virgin resonator which is counter intuitive as the mass loading effect of the $SiO_2$ layer 4 and the diamond layer 5 depositions would be expected to decrease the resonance frequency. This may be due to small differences in the ambient temperature during measurements.

In summary, a nanocrystalline diamond coated langasite thickness shear mode resonator has been demonstrated. By replacing the quartz piezoelectric with a high temperature stable piezoelectric, it was possible to grow diamond at conventional growth temperatures without the loss of the piezoelectric properties of the substrate and hence the utility of the resonator. The resulting device showed clear resonance and oscillates in air and in liquid. The diamond coating showed clear faceting by Scanning Electron Microscopy and $sp^3$ bonding by Raman spectroscopy.

EXAMPLE 2

The device used in this example is similar to the one represented in FIG. 1(a). In this case a 500 μm thick langasite crystal 1 was used with a tungsten electrode as a first electrode 3 and an aluminium electrode as a second electrode 2. The first, tungsten electrode 3 comprised 50 nm tungsten. The second, aluminium electrode 2 comprised ~300 nm aluminium. A diamond layer 5 was provided in direct contact with the tungsten electrode 3, without an interlayer between the tungsten electrode 3 and the diamond layer 5. Diamond was seeded ultrasonically with detonation nano-diamond powder in ethanol and rinsed in ethanol. Diamond was doped with boron for simultaneous electrochemical access to the surface. The boron doped diamond layer 5 was grown with 3% $CH_4$, ~5000 ppm trimethylboron diluted in hydrogen. The layer 5 of high quality diamond had a thickness of 150 nm. A much thinner diamond layer 5 can be grown on tungsten due to enhanced nucleation density.

Figure 5:
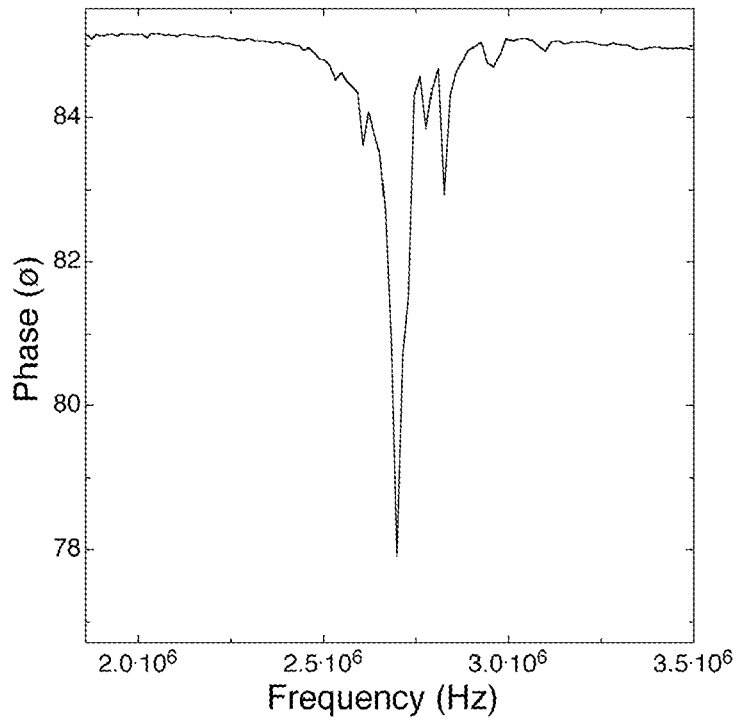
FIG. 5 shows a graph illustrating phase shift in function of frequency for a langasite thickness shear mode resonator with a tungsten and an aluminium electrode.

FIG. 5 shows the phase shift against frequency spectrum of the langasite thickness shear mode resonator of this example. It can be seen that this resonator resonates at a lower frequency, around 2.7 MHz, when compared to the resonator described in the first example and with a spectrum represented in FIG. 4. The reason for this is the thicker langasite substrate used in the present example.

EXAMPLE 3

The thickness shear mode resonator used in this case is represented in FIG. 1(b). In this case a ~300 μm thick langasite crystal 1 was used with $SiO_2$ interlayer 4 with a thickness of 100 nm and Au electrodes 2, 3 with a thickness of 200 nm. Nanocrystalline diamond with a thickness of 200 nm was grown by chemical vapour deposition on the diamond nanoparticle seeded $SiO_2$ interlayer 4. The growth conditions were 3% $CH_4$ diluted in $H_2$ at 700° C., 3500 W microwave power at 40 Torr process pressure.

Figure 6:
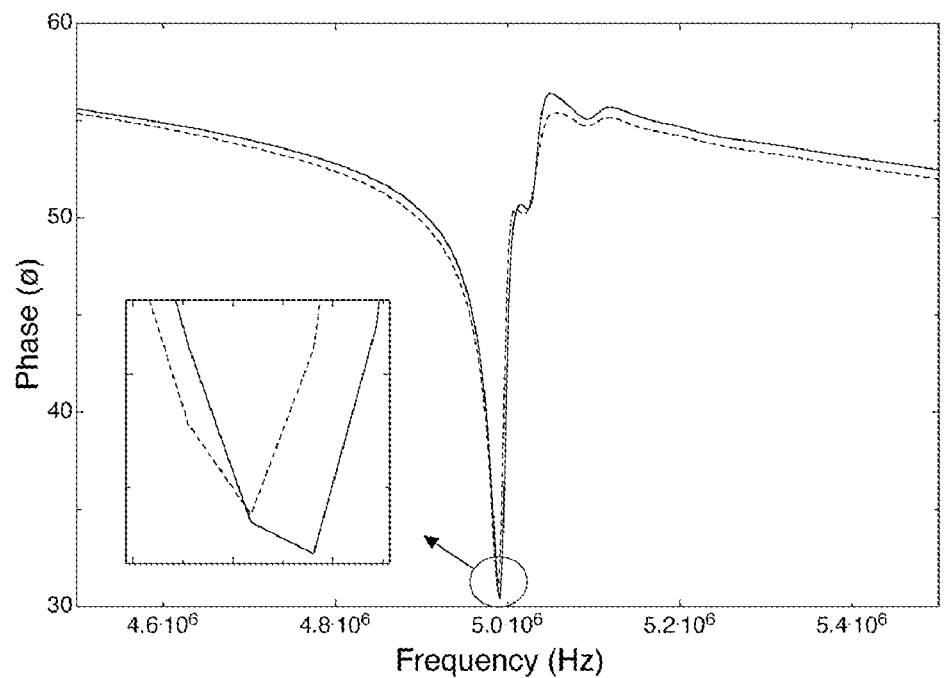
FIG. 6 shows a graph illustrating phase shift in function of frequency for a langasite/diamond thickness shear mode resonator operating in air (full line) and liquid (dotted line).

FIG. 6 shows the phase response against frequency for a langasite/nanocrystalline diamond resonator according to the present example. The full line (-) represents the measurement in air; the dotted curve (- - - -) represents the measurement in DI water. From the graph it can be seen that thickness shear mode resonator according to the present example is capable of operating in water as well as in air without the diamond layer 5 being deteriorated or damaged during operation in water. There is a very slight downshift resonance frequency and damping due to the effect of the higher viscosity of water than air.

EXAMPLE 4

The thickness shear mode resonator used in this case is represented in FIG. 1(b). In this case a ~250 μm thick $GaPO_4$ crystal 1 was used with an $SiO_2$ interlayer 4 with a thickness of 100 nm and tungsten electrodes 2, 3 with a thickness of 200 nm. Diamond with a thickness of 200 nm was grown on the diamond nanoparticle seeded $SiO_2$ interlayer 4 by Chemical Vapour Deposition. The process conditions were 3% $CH_4$ diluted in $H_2$, 700° C., 3500 W microwave power at 40 Torr.

Figure 7:
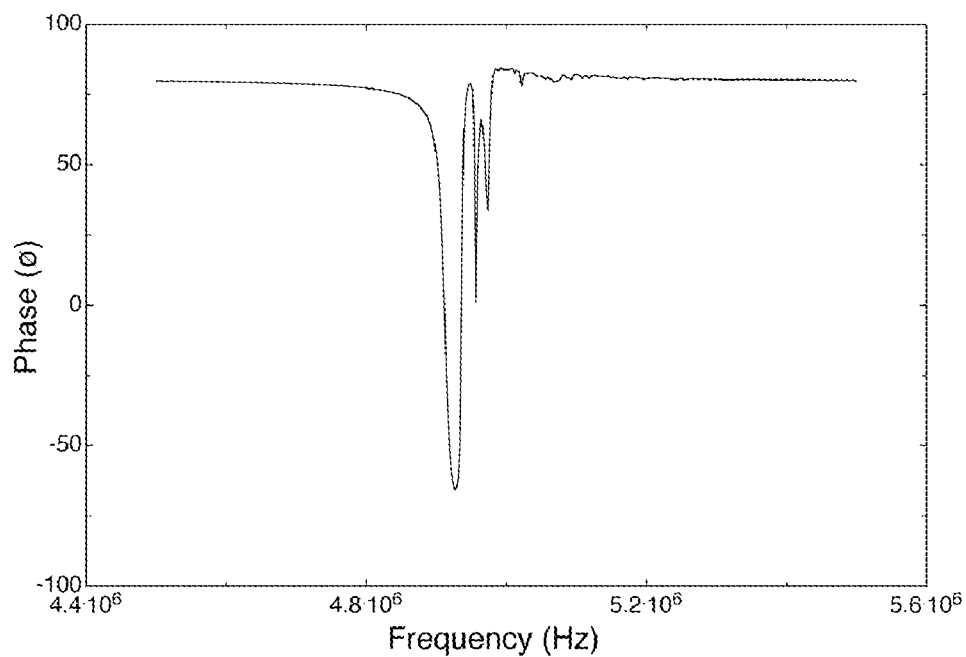
FIG. 7 shows a graph illustrating phase shift in function of frequency for a $GaPO_4$/diamond thickness shear mode resonator with an interlayer being present between the $GaPO_4$ and the diamond.

FIG. 7 shows the phase response against frequency of a $GaPO_4/SiO_2$ interlayer/nanocrystalline resonator. It can be seen that this device exhibits clear resonance behaviour around 5 MHz, as expected from the commercial crystal supplied.

It is to be understood that although preferred embodiments, specific constructions and configurations, as well as materials, have been discussed herein for devices according to the present invention, various changes or modifications in form and detail may be made without departing from the scope of this invention as defined by the appended claims.

The invention claimed is:
1. A thickness shear mode resonator comprising:
  a high temperature piezoelectric crystal having a first major surface,
  at least one interlayer on the first major surface of the high temperature piezoelectric crystal, including at least a first interlayer part being adapted for functioning as a first electrode, and at least a second interlayer part being adapted for allowing growth of a high quality diamond layer comprising at least 90% $sp^3$ bonding, and
  a high quality diamond layer on at least part of the at least one interlayer, the diamond layer comprising at least 90% $sp^3$ bonding.
2. A thickness shear mode resonator according to claim 1, wherein the first interlayer part and the second interlayer part are the same.
3. A thickness shear mode resonator according to claim 2, wherein the interlayer comprises Tungsten, Titanium, Platinum, Nickel, Aluminum, Molybdenum, Niobium, Tantalum, conductive Diamond-like Carbon, or conductive carbon, or a combination thereof.
4. A thickness shear mode resonator according to claim 1, wherein the thickness shear mode resonator comprises a plurality of interlayers, wherein at least part of a first interlayer is adapted for functioning as a first electrode, and wherein at least part of at least one further interlayer different from the first interlayer is adapted for allowing growth of a high quality diamond layer comprising at least 90% $sp^3$ bonding.
5. A thickness shear mode resonator according to claim 4, wherein the at least one further interlayer comprises silicon oxide, tungsten, titanium, platinum, Molybdenum, Niobium, Tantalum, Silicon, Silicon Carbide, Diamond-like Carbon, Amorphous carbon, Graphite, Nickel, Aluminium.

6. A thickness shear mode resonator according to claim 1, wherein the first electrode is in direct contact with the high temperature piezoelectric crystal.

7. A thickness shear mode resonator according to claim 1, wherein the first electrode is in indirect contact with the high temperature piezoelectric crystal.

8. A thickness shear mode resonator according to claim 1, wherein the high temperature piezoelectric crystal is a material with a phase transition temperature of higher than 800° C.

9. A thickness shear mode resonator according to claim 8, wherein the high temperature piezoelectric crystal comprises one of $La_3Ga_5SiO_{14}$, $La_3Ga_{5.5}Ta_{0.5}O_{14}$, $GaPO_4$, $Li_2B_4O_7$, AlN, GaN, $Al_{1-x}Ga_xN$ with $0 \leq x \leq 1$, $AlPO_4$, $Bi_4Ti_3O_{12}$, $Bi_3TiNbO_9$, $Sr_2Nb_2O_7$, $Ca_2Ga_2Ge_4SiO_{14}$, or a material having the same crystalline structure as $Ca_2Ga_2Ge_4SiO_{14}$.

10. A thickness shear mode resonator according to claim 1, further comprising a second electrode provided on a second major surface of the high temperature piezoelectric crystal, the second major surface being at a substantially opposite side of the thickness shear mode resonator than the first major surface.

11. A thickness shear mode resonator according to claim 10, wherein the second electrode is in direct contact with the high temperature piezoelectric crystal.

12. A thickness shear mode resonator according to claim 10, wherein the second electrode is in indirect contact with the high temperature piezoelectric crystal.

13. A thickness shear mode resonator according to claim 1, wherein the high quality diamond layer has a thickness of between 20 nm and 2000 nm.

14. A thickness shear mode resonator according to claim 1, wherein the thickness of the first electrode is between 5 nm and 500 nm.

15. A thickness shear mode resonator according to claim 1, wherein said high quality diamond layer comprises at least 99% $sp^3$ bonding.

16. A method comprising using a thickness shear mode resonator according to claim 1 for biosensing applications.

17. A method comprising using the thickness shear mode resonator according to claim 1 for electrochemistry applications.

18. A thickness shear mode resonator according to claim 1, wherein the high temperature piezoelectric has a Curie point of higher than 800° C.

19. A thickness shear mode resonator according to claim 1, wherein the high temperature piezoelectric has a Curie point of higher than 1000° C.

20. A thickness shear mode resonator comprising:
a piezoelectric crystal with a Curie point of higher than 800° C.;
a first interlayer on the piezoelectric crystal, the first interlayer being adapted for functioning as a first electrode;
a second interlayer on at least one of i) the piezoelectric crystal and ii) the first interlayer, the second interlayer being adapted for allowing the growth of a high quality diamond layer, wherein the second interlayer comprises silicon oxide, tungsten, titanium, platinum, Molybdenum, Niobium, Tantalum, Silicon, Silicon Carbide, Diamond-like Carbon, Amorphous carbon, Graphite, Nickel, or Aluminium; and
a high quality diamond layer grown directly on at least part of the second interlayer, the diamond layer comprising at least 90% $sp^3$ bonding.

21. A thickness shear mode resonator according to claim 20, wherein the high temperature piezoelectric has a Curie point of higher than 1000° C.

22. A thickness shear mode resonator comprising:
a piezoelectric crystal with a Curie point of higher than 800° C.;
an interlayer on the first major surface of the high temperature piezoelectric crystal, wherein the interlayer is adapted for functioning as an electrode and adapted for allowing the growth of a high quality diamond layer, and wherein the interlayer comprises Tungsten, Titanium, Platinum, Nickel, Aluminum, Molybdenum, Niobium, Tantalum, conductive Diamond-like Carbon, or conductive carbon, or a combination thereof; and
a high quality diamond layer grown directly on at least part of the at least one interlayer, the diamond layer comprising at least 90% $sp^3$ bonding.

23. A thickness shear mode resonator according to claim 22, wherein the high temperature piezoelectric has a Curie point of higher than 1000° C.

24. A thickness shear mode resonator according to claim 22, wherein the interlayer is in direct contact with the high temperature piezoelectric crystal.

* * * * *